United States Patent [19]

Wallmark et al.

[11] 3,922,709

[45] Nov. 25, 1975

[54] SEMICONDUCTING ELEMENT HAVING IMPROVED VOLTAGE ENDURANCE PROPERTIES

[75] Inventors: John Torkel Wallmark, Goteborg; Mieczyslaw Bakowski, Angered, both of Sweden

[73] Assignee: Allmanna Svenska Elektriska Aktiebolaget, Sweden

[22] Filed: Nov. 16, 1973

[21] Appl. No.: 416,669

[30] Foreign Application Priority Data

Nov. 17, 1972 Sweden ............................ 14937/72

[52] U.S. Cl. ...................... 357/53; 357/52; 357/54; 357/72; 357/90; 357/38

[51] Int. Cl.² .................... H01L 29/40; H01L 29/34; H01L 23/28; H01L 29/74

[58] Field of Search ....... 317/234 E, 234 W, 234 G, 317/235 AG; 357/48, 49, 52, 53, 54, 72, 90

[56] References Cited

UNITED STATES PATENTS

| | | | |
|---|---|---|---|
| 3,160,520 | 12/1964 | Jäntsch et al. | 357/52 |
| 3,320,495 | 5/1967 | Fox et al. | 357/72 |
| 3,413,527 | 11/1968 | Davies | 357/38 |
| 3,597,269 | 8/1971 | Chang et al. | 357/72 |
| 3,601,667 | 8/1971 | Desmond et al. | 357/72 |
| 3,787,251 | 1/1974 | Brand et al. | 357/23 |

FOREIGN PATENTS OR APPLICATIONS

| | | | |
|---|---|---|---|
| 1,248,810 | 8/1967 | Germany | 357/52 |

*Primary Examiner*—Andrew J. James
*Assistant Examiner*—Joseph E. Clawson, Jr.
*Attorney, Agent, or Firm*—Robert E. Burns; Emmanuel J. Lobato; Bruce L. Adams

[57] ABSTRACT

A semiconductor of the kind comprising at least one pn-junction the doping of which in the p-region (n-region) increases continuously or gradually from the pn-junction, and also having an isolating surface layer at least at the marginal portion of said pn-junction. In this semiconductor a first portion of said surface layer is positioned outside the substantially p-doped (n-doped) region, and a second portion of said surface layer is positioned outside the n-doped (p-doped) region of said pn-junction, said first portion having a permanently negative (positive) surface charge relative to said second portion.

13 Claims, 10 Drawing Figures

SEMICONDUCTING ELEMENT HAVING IMPROVED VOLTAGE ENDURANCE PROPERTIES

BACKGROUND OF THE INVENTION

The present invention concerns a semiconductor element comprising at least one pn-junction in which in the p-region (or the n-region) the doping increases continuously or gradually from the pn-junction, and an isolating surface layer at least at the marginal portion of the pn-junction.

Diodes and thyristors which are used to rectify high voltages, contain as the voltage receiving portion one or several pn-junctions. The voltage endurance of pn-junctions, i.e., their maximum barrier tension possible, is in practice limited by the surface structure of the semiconductor crystal as it is at the surface that irregularities in the lattice and other non-desirable characteristics of the crystal occur most frequently. In addition, the electric field is often higher in the vicinity of the surface than in the crystal interior because the value of the dielectricity constant of the semiconductor material and that of the isolating layer are different, and also on account of the occurrence of non-advantageous surface charge. The maximum value of the electric field in the depletion area occurs on the surface and immediately beneath the surface depending on the doping conditions, the concentration of the surface charge and polarity, and on the dimension of the angle formed by the margin surface and the plane of the pn-junction. Thus, break-through generally occurs on or immediately beneath the crystal surface.

To improve the voltage endurance in this respect, attempts have been made to cut the crystal in a known manner such that its margin surface at the pn-junction forms an oblique angle with the pn-junction plane. More often than not the crystals are in the shape of rotationally symmetrical discs wherein the obliquely cut surfaces are in the form of the jacket surface of a truncated cone. The angle-cutting gives the effect of reducing the electric field strength on the surface and immediately below it. However, the electric field strength below the surface is reduced to a lesser degree than is the electric field strength on the surface. This means that very small cut angles are required, i.e., a small angle between the plane of the pn-junction and that of the margin surface in order to enable the break-through voltage to obtain a value close to the maximum voltage endurance inside the crystal, and that the break-through voltage thus primarily is dependent on the field beneath the surface. The maximum voltage endurance possible is obtained in a diode when the break-through is controlled by the electric field along the symmetry line of the crystal. The maximum voltage endurance is obtained, in practice, when the electric field strength in the depletion area nowhere exceeds that in the volume (along the symmetry line of the crystal) and when the electric field strength on the surface by a sufficient amount is lower than in the volume, while considering the lower voltage endurance of the surface.

SUMMARY OF THE PRESENT INVENTION

In accordance with the teachings of the present invention is provided a semiconductor element having further improved voltage endurance characteristics. The semiconductor element in accordance with the invention is for this purpose characterised in that a portion of the surface layer positioned essentially outside the p-doped (n-doped) region of the pn-junction is permanently negatively (positively) surface charged relative to a portion of the surface layer positioned outside the n-doped (p-doped) region of the pn-junction.

The semiconductor element in accordance with the invention possesses considerably improved voltage endurance characteristics relative to hitherto known semiconductors when comparing corresponding dimensions. Further, an angle-cut semiconductor in accordance with the invention may be formed with a less obliquely cut angle than a prior-art semiconductor having a maximum oblique angle and still possess the same voltage endurance, which means that the dimensions of a semiconductor in accordance with the present invention may be smaller than the dimensions of a semiconductor of a known kind having the same voltage endurance, or that, e.g., the cathode area may be increased without involving an increase of the diameter of the silicon disc and still the voltage endurance may be maintained.

BRIEF DESCRIPTION OF THE DRAWINGS

The invention will be described more in detail in the following and explained with reference to a few embodiments illustrated in the accompanying drawings. In the drawings.

DETAILED DESCRIPTION OF PREFERRED EMBODIMENTS

Figure 1:
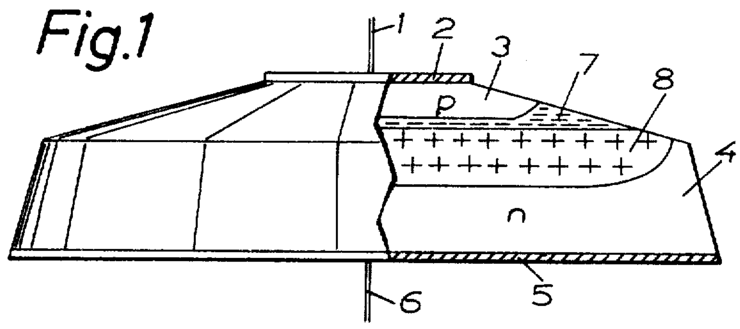
FIG. 1 is a section through a diode of a known angle-cut kind wherein is indicated the extension of the depletion layer in blocked condition.

In FIG. 1 is shown a silicon diode which is suitable for rectifying high voltages. The diode is rotationally symmetrical and cut to such a refractional angle that each cut surface forms the jacket surface of a truncated cone. The diode consists of a conduit 1, a metal contact 2, e.g., of aluminum, a silicon disc having a p-doped region 3 and an n-doped region 4, a metal contact 5, and a conduit 6. When a positive voltage is applied to the diode in the back direction a depletion layer is formed which consists of an area 7 in the p-doped region and an area 8 in the n-doped region.

At the marginal surface of the silicon disc 3, 4 the depletion layer 7, 8 takes on the upwardly bent appearance indicated in FIG. 1. This is due to the fact that, as a whole, neutrality of charge prevails at the depletion layer 7, 8 of the pn-junction whereby every stable negative charge (ionized acceptor) in the p-doped region 3 is compensated by a stable positive charge (ionized donor) in the n-doped region. As a result of the angle-cutting which removes a large number of potential acceptors and thus possible negative charges from the p-doped region at the marginal portion of the silicon disc 3, 4, the deple[illegible]n layer thus bends upwards such that the same number of charges as in the positive area 8 still exist in the depletion layer area 7. Also in the n-doped region 4 the depletion layer will as a consequence hereof bend upwards at the margin such that a somewhat smaller number of ionized donors will be included in the marginal portion of the layer.

However, in practical application the p-doped side is in most cases more strongly doped than the n-doped one, the concentration increasing as viewed in the direction from the pn-junction. In the p-doped region, the depletion area, thus will penetrate into comparatively highly doped material and as a result thereof the maximum electric field strength will be high and localized on the highly doped p-side whereas the maximum field strength along the symmetry line for the crystal is lower and localized to the junction between the p-doped and the n-doped sides. At the same time, the surface field is highly reduced as the width of the depletion area along the surface exceeds the width of the depletion area along the symmetry line of the crystal. It appears herefrom that it is the field beneath the surface that controls the break-through and that the magnitude of the break-through voltage is less than the maximum possible voltage endurance of the diode.

Figure 2:
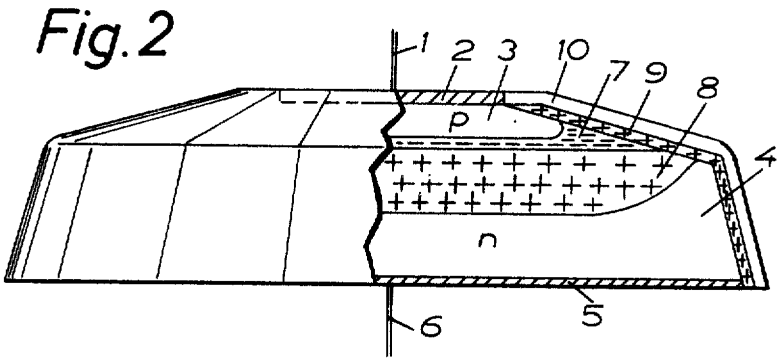
FIGS. 2 and 3 illustrate the appearance of the barrier layer in the same diode as in FIG. 1 when the surface layer is positively or negatively charged.

In practice, the situation is complicated by the fact that the surface contains separate electric charges positioned in the junction between the silicon disc 3, 4 and a surrounding oxide layer 9 (see FIG. 2), within the oxide layer, or possibly on the oxide surface, in a protective layer 16 covering the oxide, or outside this layer. As these possibilities are essentially equivalent the following description is made with reference to the case only with charges in the oxide layer.

In conventional silicon diodes this surface charge is positive and requires compensation in the form of fixed negative charges in the p-doped layer. For this reason, the border of the depletion layer in the case of positive surface charge becomes even more bent upwards than in the case of diodes without surface charge (see FIG. 2), which means that the depletion layer penetrates into still heavier doped material resulting in further reduction of the break-through voltage. In addition, the bending upwards becomes more pronounced also on the n-doped side than in the case of a diode having an uncharged surface layer, a situation which also contributes to reducing the break-through voltage.

Figure 3:
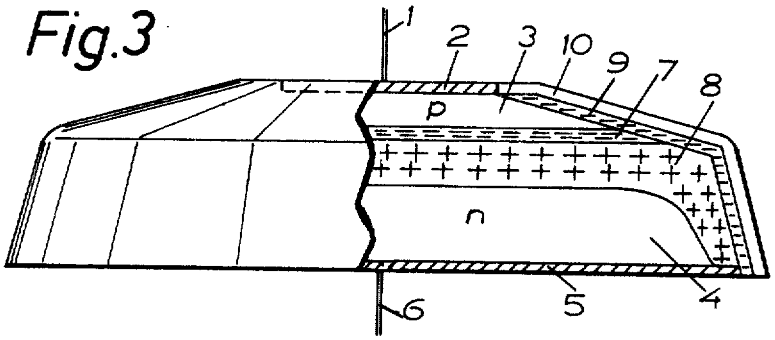

If on the other hand, the surface charge had been negative (see FIG. 3), the border of the depletion layer on the p-doped side would not be so strongly bent upwards which would positively influence the value of the break-through voltage. However, for a negative charge to have a significant effect it must be comparatively strong in view of the comparatively heavy doping present in the p-region. Such a strong surface charge would, on the n-doped side with its comparatively weak doping, give too strong an effect such that already at a low voltage charge the depletion layer would bend downwards towards and into contact with the bottom contact, i.e., so called "punch through" would occur.

Figure 4:
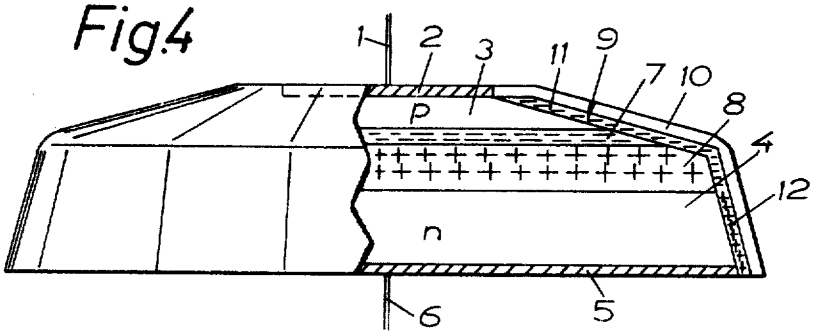
FIG. 4 illustrates the same diode but wherein the surface layer has a charge distribution in accordance with the invention.

In a diode in accordance with the present invention (see FIG. 4) the surface layer is divided from the point of view of charge into two portions 11 and 12, respectively. The portion 11 which is positioned outside the p-doped region 3 of the silicone disc has a negative charge which is suitable for the depletion layer of the p-doped region such that this portion 7 of the depletion layer will not deflect in the direction of the high doping, and the portion 12 of the depletion layer which is positioned outside the n-doped region has a positive charge suitable for the depletion layer of the n-doped region such that this portion 8 of the depletion layer will not deflect too strongly towards the bottom contact 5. To achieve a more favorable spreading of the depletion layer the negatively charged portion of the surface layer preferably extends somewhat down over the n-doped area where the surface layer then gradually passes into a state of positive charge. A steep junction would contain high electric fields which would be unfavourable. The structure aimed for of the depletion area is that the depletion area on the p-doped side does not reach into the highly doped area, that on the n-doped sides it does not reach the bottom contact (or other pn-junction, e.g., in a thyristor, see FIG. 5) and that at the same time the width of the depletion area along the surface is sufficiently large to reduce the surface field below the critical value corresponding to the reduced voltage endurance of the surface. A diode in accordance with the invention having a surface layer charged as described possesses a considerably higher break-through voltage than diodes described with reference to FIGS. 1, 2, and 3.

Figure 5:
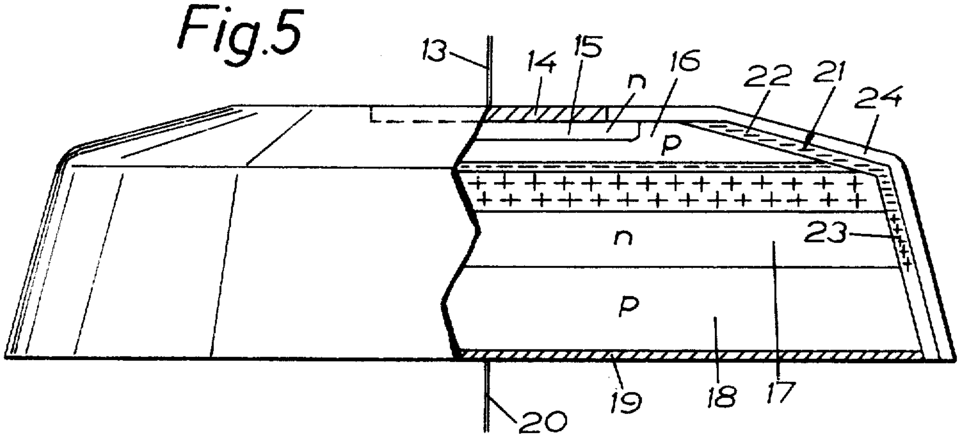
FIG. 5 illustrates the inventive object when applied as a thyristor.

In FIG. 5 are illustrated a thyristor having a surface layer which has been charged in accordance with the teachings of the invention. The thyristor consists of conduit 13, a metal contact 14, a silicone disc comprising one n-doped layer 15, one p-doped layer 16, one n-doped layer 17 and one p-doped layer 18, a metal contact 19 and a conduit 20. The silicon disc is covered by a surface layer 21. The control electrode has been eliminated for the sake of simplicity. The thyristor is angle-cut in the same manner as the diodes described above, the second uppermost pn-junction having a marginal portion which geometrically and electrically corresponds to the marginal portion of the pn-junction in the diodes described above, and it is this pn-junction of the thyristor that takes on the major portion of the voltage when the thyristor blocks off currents in the direction upwards in accordance with FIG. 5. To eliminate in the same manner as in diodes the upwards bend or too heavy bends downwards of the depletion layer of this pn-junction at the marginal portion of the silicon disc, the surface layer 21 is, from the point of view of charge, divided into one negatively charged portion 22 extending outside the p-doped region and over a distance downwards on the n-doped region in question, and one positively loaded portion 23 positioned outside the essentially n-doped region. The surface layer also comprises a layer 24 of silicon rubber. The appearance of the depletion layer thus is the one illustrated schematically in FIG. 5.

When the thyristor blocks off a current in the downwards direction illustrated in FIG. 5 it is the lowermost pn-junction that accepts the major portion of the barrier voltage. However, the geometrical conditions at this pn-junction are different. The p-doped region, comparatively highly doped relative to the n-region, increases its diameter in contrast to the p-region of the above-described pn-junction, with increased distance from the pn-junction, and the comparatively mildly doped n-region has a decreasing diameter as compared with the pn-junction. Consequently, the depletion layer will bend somewhat upwards in the case of a neutral surface layer but since it will not enter into the more highly doped area in this case (the mildly doped side, in this case the n-doped one, usually having a constant doping), this does not lead to the generation of a high field beneath the surface. Further, the surface field is strongly reduced depending on the width of the depletion layer at the surface. This reduction of the surface field is sufficient to result therein that a slight concentration of positive charges necessary to avoid punch through, will not result in a critical increase of the surface field. In addition, the cut angle is considerably larger at this marginal portion than at the pn-junction described above. Common values of the various cut angles are 45° and 1°, respectively.

The invention likewise concerns a method of manufacturing a semiconductor of the kind described above. The method is characterised by imparting to a surface portion positioned externally of the substantially p-doped (n-doped) region of the pn-junction, a permanently negative (positive) surface charge relative to a surface portion positioned externally of the n-doped (p-doped) region of the pn-junction.

One possibility of realizing this method is to expose the oxide layer surrounding the periphery of the silicon disc to a ionic bombardment. This operation preferably is carried out as described in the following.

First, both the portion of the oxide layer positioned outside the p-doped region and that positioned outside the n-doped region are given a charge which is favorable to the n-doped region, by means of ionic bombardment, heat treatment, or possibily chemical etching being used to achieve this. Then, to the pn-junction is applied a comparatively high voltage and the pn-junction is exposed to a bombardment of charged ions, care being taken that the n-side has a voltage ensuring that the ions do not at all or only to a small extent hit the surface layer on the n-side. The bombardment is carried out until the surface charge value most favorable to the p-doped side is obtained in the portion of the surface layer positioned essentially outside the p-doped region. The fact that ionic bombardment of a silicon surface covered by silicon dioxide, $SiO_2$, gives rise to a negative surface charge is already known and disclosed for instance in "Surface states induced by ion implantation" by W. Fahrner and A. Goetzberger, II International conference on ion implantation in Semiconductors, May 1971.

In addition, ionic bombardment has the favorable effect of imparting to the oxide layer, in addition to the desired surface charge, improved dielectric strength as the regularities of the lattice are destroyed and a more amorphous crystal is obtained. Following the ionic bombardment the crystal preferably is heat treated to heal radiation wounds and similar damages and to obtain the best possible performance of the pn-junction.

To further illustrate the importance of the invention one example will be described in the following giving the exact values. In FIG. 5 is illustrated in detail the expansion of the depletion layer at the margin of a pn-junction in a crystal cut to an angle of 6°. The p-doped region is more highly doped than is the n-doped region which was assumed to have a concentration of $6 \cdot 10^{13}$ $cm^{-3}$. Thus, an impurity of p-type having a surface concentration of $3 \cdot 10^{19}$ $cm^{-3}$ was diffused in 90 $\mu m$ and another impurity of p-type having a surface concentration of $1.5 \cdot 10^{16}$ $cm^{-3}$ was diffused in 100 $\mu m$. A positive surface charge of $10^{12}$ $cm^{-2}$ was assumed. The depletion layer, upon an applied voltage of 1640 V, i.e., the maximum barrier tension, takes on the expansion illustrated in FIG. 6. The maximum field strength was calculated to 217 kV/cm and as appears from FIG. 6 it occurs at the upwards bend of the depletion layer in the p-doped portion. The maximum field strength inside the volume, i.e., close to the symmetry axis of the silicon crystal, is only 149 kV/cm, which means that upon further increased voltage charge break-through will occur close to the surface. Consequently, it is the conditions prevailing at the surface that limit the voltage endurance of the semiconductor.

Figure 7:
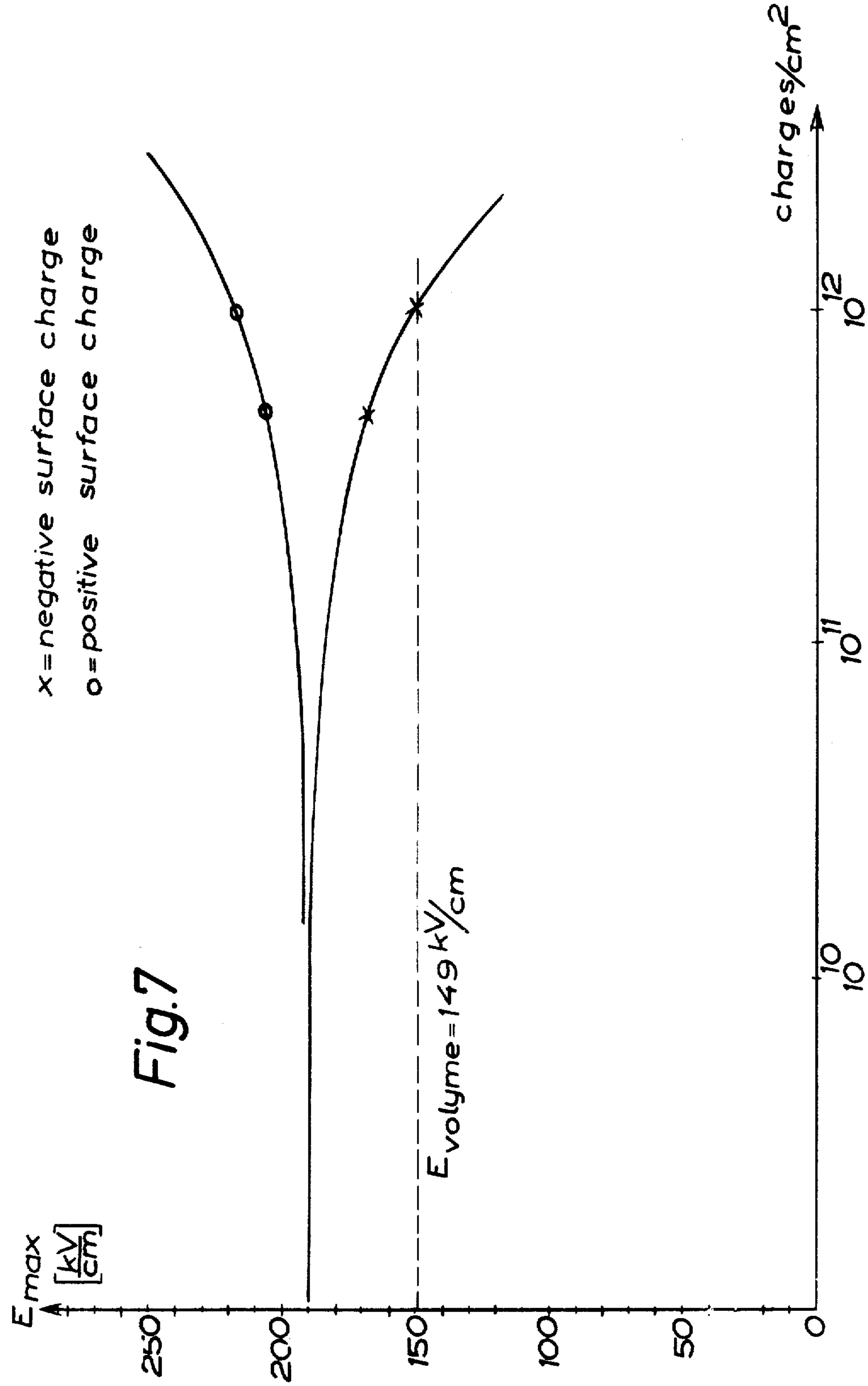

If the above calculation of the field strengths of the depletion layer is carried out for different values of the surface charge a diagram of the kind illustrated in FIG. 7 may be plotted. This diagram shows the maximum field strength in the p-doped region as a function of the concentration of the surface charge, the calculated values of positive and negative surface charges having been marked as dots and crosses, respectively. The diagram includes a dotted line indicating the maximum field strength in the volume, i.e., 149 kV/cm. It appears from the diagram that positive surface charge only deteriorate the situation whereas the field strength curve indicating negative surface charge intersects the line indicating 149 kV/cm at a value of surface charge of appr. $^{-}$$10^{12}$ $cm^{-2}$. A negative surface charge exceeding $10^{12}$ $cm^{-2}$ thus gives a lower maximum field strength on or immediately below the surface than in the interior of the chrystal. This is desirable and means that the marginal portion in this case does not limit the voltage endurance of the semiconductor to a value which is lower than the value prevailing inside the silicone disc.

Figure 6:
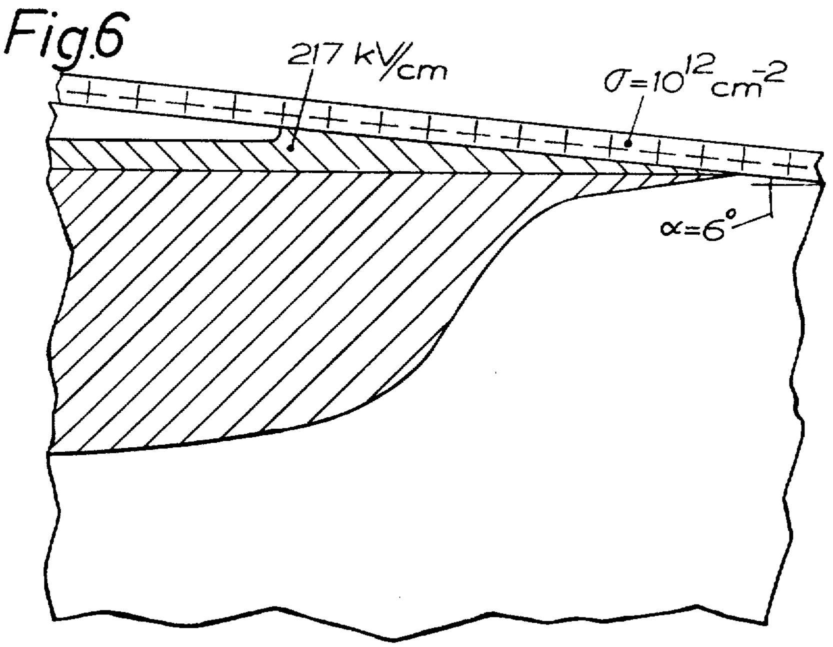
FIGS. 6, 7, and 8 illustrate in diagram form a comparative example showing calculated values.
Figure 8:
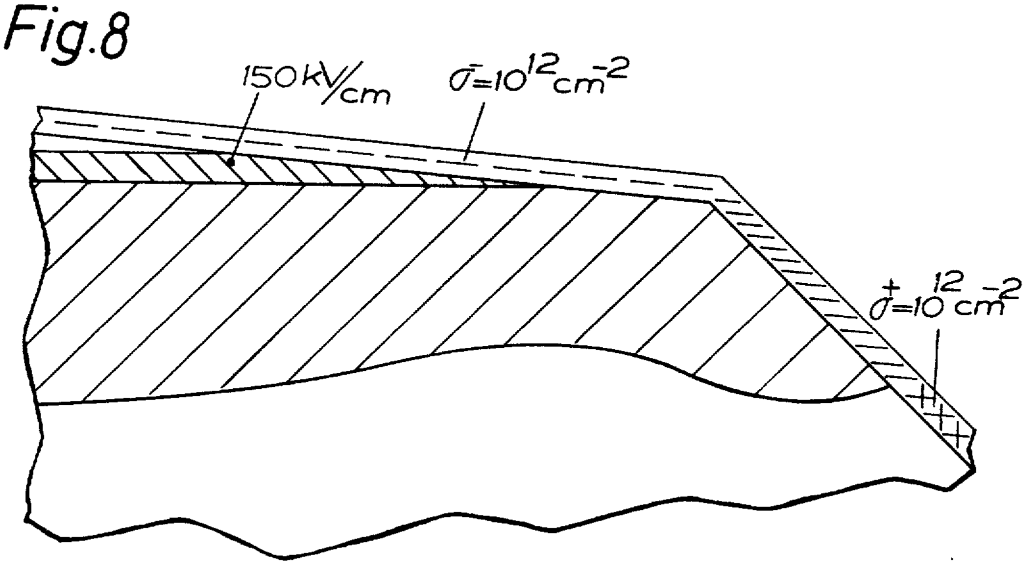
Figure 9:
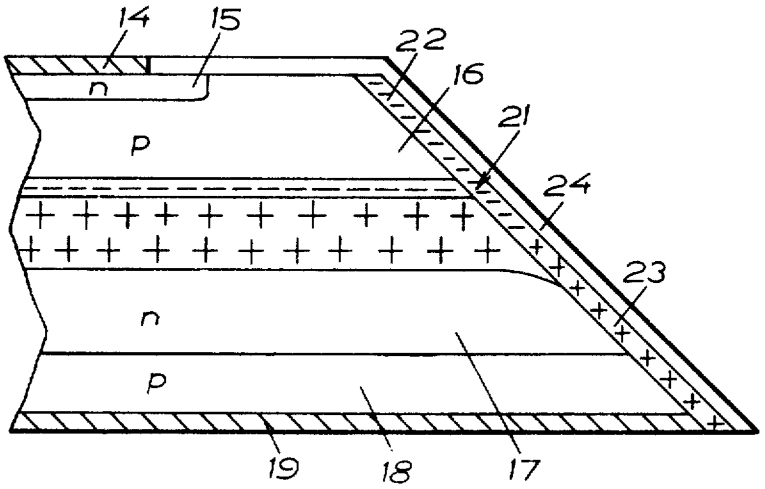
FIGS. 9 and 10 illustrate possible applications of the inventive object in various thyristors having differently cut angles.
Figure 10:
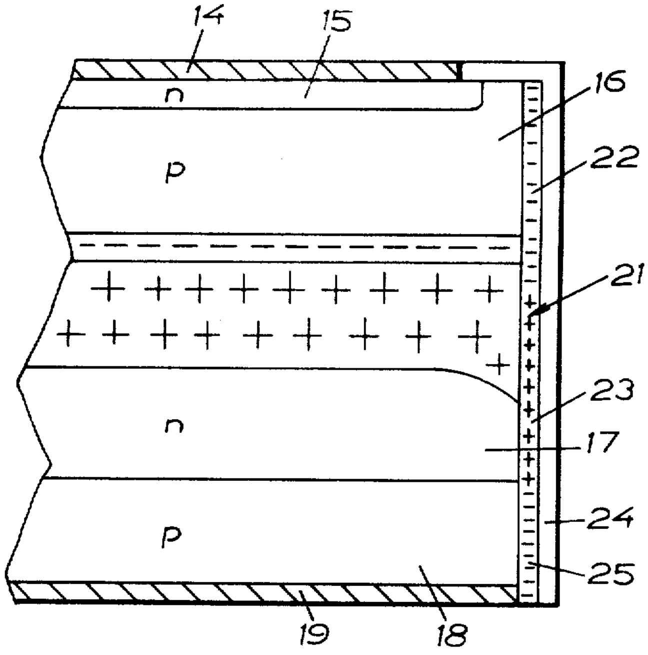

FIG. 8 illustrates the expansion of the depletion layer for the same semiconductor as in FIG. 6 but having a negative surface charge of $10^{12}$ $cm^{-2}$ outside the p-doped region and over an area corresponding to the maximum expansion of the barrier layer down on the n-doped region and having a positive surface charge of $10^{12}$ $cm^{-2}$ outside the remainder of the n-doped region. The maximum field strength is in this case estimated to 150 kV/cm and it occurs immediately beneath the surface of the silicon disc. Through this arrangement is achieved that the break-through voltage will be approximately the same at the surface as inside the crystal and thus it is not significantly limited by the conditions prevailing at the surface. In FIGS. 9 and 10 are illustrated the applications of the invention not only to increase the break-through voltage for a given structure having definite doping conditions and a given marginal profile, but also to increase the cathode area for a given size of the semiconductor disc. FIG. 9 thus illustrates an angle-cut crystal having no refractional angle in the cut and FIG. 10 illustrates a crystal having a completely straight marginal portion, both the voltage-receiving pn-junctions, which in this case are geometrically identical at the marginal portions, being provided with a surface layer having a charge distribution in accordance with the invention with a further negatively charged portion 25. Otherwise in FIGS. 9 and 10 the same designations as in FIG. 5 are used for corresponding details.

The invention is not limited to the embodiments as illustrated and described above but various modifications are possible within the scope of the appended claims. The junction between negative and positive surface charges is not fixed to the maximum extension of the depletion area but may be positioned differently. The invention is also applicable to crystals which have been angle-cut in another way than those shown above and it may be applied to several pn-junctions in the same semiconductor. It is not necessary that the various charged parts of the surface layer consist of one positive and one negative portion but both may be positive or negative with the positive and negative charges differing in magnitude. By surface charge is to be understood in this connection that the charge may be distributed inside the surface layer, between this layer and the semiconducting element proper, or between the surface layer and the surrounding atmosphere.

The invention is not limited to semiconductors of silicon but also other semiconducting materials may be used. The isolating layer may, in order to obtain varying surface charge, consist of substances having special characteristics in this respect, for instance silicone nitride applied through thermical disintegration of silane in an ammonium and/or nitrogen gas atmosphere known to contain positive charges, and aluminum oxide applied in a similar way and containing negative charges. The layer may also be applied through so called cathode sputtering. It is likewise possible to apply the layer through electrolysis. During the ionic bombardement doped ions may be implanted into the semiconductor immediately below the surface, whereby a thin layer of doped material is obtained which may be of p- or n-type depending on the choice of the kind of ions used.

Finally should be added that the invention naturally is completely applicable also in the semiconductors which are complements to the semiconductors described above, i.e., when n is exchanged for p, p is exchanged for n, positive exchanged for negative and negative exchanged for positive as regards the charge of the doped layers and that of the surface layer.

What we claim is:

1. An improved high voltage semiconductor element comprising, a body of semiconductor material having a p-doped region and an n-doped region and a pn-junction therebetween, said pn-junction intersecting the surface of said body, and an isolating surface layer at least at said intersection and on both sides thereof, said surface layer having a permanent electrical charge, said p-region having a degree of doping which increases with the distance from said pn-junction, the improvement which comprises a first portion of said surface layer at the surface of said p-region adjacent said intersection, and a second portion of said surface layer at the surface of said n-region adjacent said intersection and contiguous with said first portion, and said first portion having a permanent surface charge which is negative relative to the permanent surface charge of said second portion.

2. An improved semiconductor element as claimed in claim 1, in which said first surface layer portion has a negative surface charge, and said second portion has a positive charge.

3. An improved semiconductor element as claimed in claim 1, in which said first and said second portions of said surface layer have a negative surface charge.

4. An improved semiconductor element as claimed in claim 1, in which said first and said second portions of said surface layer have a positive surface charge.

5. An improved semiconductor element as claimed in claim 1, in which the junction between said first and said second portions of said surface layer with different surface charges has a gradual change in concentration of surface charges.

6. An improved semiconductor element as claimed in claim 1, in which the junction between said first and said second portions of said surface layer is essentially parallel with said intersection portion of said pn-junction and the surface, and said junction being positioned overlying said n-doped region.

7. An improved semiconductor element as claimed in claim 6, in which said surface charge is positioned essentially at the junction between said surface layer and the semiconducting material proper.

8. A semiconductor as claimed in claim 6, in which said surface charge is positioned essentially inside said surface layer.

9. A semiconductor element as claimed in claim 6, in which said surface charge is positioned essentially at the outer face of said surface layer.

10. A semiconductor element as claimed in claim 8, wherein said surface layer consists of an electrically isolating layer, comprising an oxide, and a layer of an essentially mechanically isolating material comprising silicon rubber, and said surface charges being positioned essentially at the junction between said two layers.

11. A semiconductor element as claimed in claim 8, wherein said surface layer consists of an electrically isolating layer comprising an oxide, and a layer of an essentially mechanically and electrically isolating material comprising silicon rubber, and said surface charges being positioned essentially in said mechanically isolating material.

12. A semiconductor element as claimed in claim 8, wherein said surface layer consists of an electrically isolating layer comprising an oxide, and a layer of an essentially mechanically isolating material comprising silicon rubber, and said surface charges being positioned essentially in said electrically isolating material.

13. An improved semiconductor element as claimed in claim 1, in which said semiconductor body has the form of a flat disc with a bevelled edge surface and comprising a plurality of pn-junctions, one of said junctions intersecting said edge surface, and said first and second portions of said surface layer being positioned at said edge surface adjacent said pn-junction.

* * * * *